United States Patent
Fu et al.

(10) Patent No.: US 8,927,423 B2
(45) Date of Patent: Jan. 6, 2015

(54) METHODS FOR ANNEALING A CONTACT METAL LAYER TO FORM A METAL SILICIDATION LAYER

(71) Applicants: Xinyu Fu, Pleasanton, CA (US); Wei Tang, Santa Clara, CA (US); Kavita Shah, Mountain View, CA (US); Srinivas Gandikota, Santa Clara, CA (US); San H. Yu, Cupertino, CA (US); Avgerinos Gelatos, Redwood City, CA (US)

(72) Inventors: Xinyu Fu, Pleasanton, CA (US); Wei Tang, Santa Clara, CA (US); Kavita Shah, Mountain View, CA (US); Srinivas Gandikota, Santa Clara, CA (US); San H. Yu, Cupertino, CA (US); Avgerinos Gelatos, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/714,588

(22) Filed: Dec. 14, 2012

(65) Prior Publication Data

US 2013/0157460 A1    Jun. 20, 2013

Related U.S. Application Data

(60) Provisional application No. 61/576,812, filed on Dec. 16, 2011.

(51) Int. Cl.
*H01L 21/44* (2006.01)
*H01L 29/40* (2006.01)

(52) U.S. Cl.
CPC .................................... *H01L 29/401* (2013.01)
USPC ............................ 438/664; 438/592; 438/655

(58) Field of Classification Search
CPC .................... H01L 21/28518; H01L 21/76843
USPC ......... 438/299–300, 592–593, 649, 651, 655, 438/660–664
See application file for complete search history.

(56) References Cited

U.S. PATENT DOCUMENTS

| | | |
|---|---|---|
| 4,589,193 A | 5/1986 | Goth et al. |
| 5,888,888 A | 3/1999 | Talwar et al. |
| 6,207,487 B1 | 3/2001 | Kim et al. |
| 6,242,808 B1 | 6/2001 | Shimizu et al. |
| 6,251,242 B1 | 6/2001 | Fu et al. |
| 6,277,249 B1 | 8/2001 | Gopalraja et al. |
| 6,284,646 B1 | 9/2001 | Leem |
| 6,305,314 B1 | 10/2001 | Sneh et al. |
| 6,319,784 B1 * | 11/2001 | Yu et al. ..................... 438/301 |
| 6,335,240 B1 | 1/2002 | Kim et al. |
| 6,344,419 B1 | 2/2002 | Forster et al. |
| 6,348,376 B2 | 2/2002 | Lim et al. |
| 6,358,829 B2 | 3/2002 | Yoon et al. |
| 6,372,598 B2 | 4/2002 | Kang et al. |
| 6,399,491 B2 | 6/2002 | Jeon et al. |
| 6,416,822 B1 | 7/2002 | Chiang et al. |
| 6,428,859 B1 | 8/2002 | Chiang et al. |

(Continued)

*Primary Examiner* — Thanhha Pham
(74) *Attorney, Agent, or Firm* — Patterson & Sheridan, LLP

(57) ABSTRACT

Methods for annealing a contact metal layer for a metal silicidation process are provided in the present invention. In one embodiment, a method for annealing a contact metal layer for a silicidation process in a semiconductor device includes providing a substrate having a contact metal layer disposed thereon in a thermal annealing processing chamber, providing a heat energy to the contact metal layer in the thermal processing chamber, supplying a gas mixture including a nitrogen gas and a hydrogen gas while providing the heat energy to the contact layer in the thermal processing chamber, wherein the nitrogen gas and the hydrogen gas is supplied at a ratio between about 1:10 and about 1:1, and forming a metal silicide layer on the substrate.

18 Claims, 4 Drawing Sheets

(56) References Cited

U.S. PATENT DOCUMENTS

| | | |
|---|---|---|
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,599,819 B1 | 7/2003 | Goto |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 6,825,115 B1 | 11/2004 | Xiang et al. |
| 6,867,130 B1 | 3/2005 | Karlsson et al. |
| 6,897,118 B1 | 5/2005 | Poon et al. |
| 2003/0059538 A1 | 3/2003 | Chung et al. |
| 2005/0074956 A1 | 4/2005 | Autryve et al. |
| 2005/0186765 A1 | 8/2005 | Ma et al. |
| 2006/0079086 A1 | 4/2006 | Boit et al. |
| 2006/0091493 A1 | 5/2006 | Wu |
| 2006/0105515 A1 | 5/2006 | Amos et al. |
| 2006/0105557 A1 | 5/2006 | Klee et al. |
| 2007/0209931 A1 | 9/2007 | Miller |

\* cited by examiner

METHODS FOR ANNEALING A CONTACT METAL LAYER TO FORM A METAL SILICIDATION LAYER

CROSS-REFERENCE TO RELATED APPLICATIONS

This application claims benefit of U.S. Provisional Application Ser. No. 61/576,812 filed Dec. 16, 2011, which is incorporated by reference in its entirety.

BACKGROUND OF THE INVENTION

1. Field of the Invention

Embodiments of the invention generally relate to the field of semiconductor manufacturing processes, more particularly, to methods for annealing a contact metal layer disposed in contact structures to form a metal silicide layer for semiconductor devices.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. Reliably producing sub-half micron and smaller features is one of the key technologies for the next generation of very large scale integration (VLSI) and ultra large-scale integration (ULSI) of semiconductor devices. However, as the limits of integrated circuit technology are pushed, the shrinking dimensions of interconnects in VLSI and ULSI technology have placed additional demands on processing capabilities. Reliable formation of the gate pattern is important to integrated circuits success and to the continued effort to increase circuit density and quality of individual substrates and die.

As feature sizes have become smaller, the demand for higher aspect ratios, defined as the ratio between the depth of the feature and the width of the feature, has steadily increased to 20:1 and even greater. Typically, the contact structure usually includes a silicide, such as nickel silicide (NiSi), cobalt silicide ($CoSi_2$), or titanium silicide ($TiSi_2$) layer. Cobalt silicide and nickel silicide are becoming popular for smaller geometries, e.g., geometries having aspect ratios of about 20:1 or smaller, because CoSi and NiSi are widely available and have lower resistivity and lower contact resistance compared to other metal silicides.

In a typical fabrication process, a pre-clean process is performed before the metal silicide is formed on a substrate in one vacuum environment. Subsequently, a contact metal layer is deposited on the substrate using a physical vapor deposition process followed by a thermal process to perform a metal silicidation process. During the thermal processing process, the heat energy provided during the metal silicidation process may assist crystallization of the metal silicide layer, thereby affecting the overall electrical performance, such as working function shift, of the semiconductor devices. Furthermore, poor crystallinity of the metal silicide layer may also result in undesired high contact resistance, thereby resulting in poor electrical properties of the device characteristics. In addition, poor nucleation resulted from inappropriate thermal energy processing during the metal silicidation process may further result in different stoichiometric ratios of metal elements to silicon elements formed in the resultant metal silicide layer, which may impact not only on the electrical performance of the devices, but also on the integration of the deposition of the conductive contact material subsequently formed thereon.

Therefore, there is a need for an improved method for annealing a contact metal layer to fabricate a metal silicide fabrication process.

SUMMARY OF THE INVENTION

Methods for annealing a contact metal layer for a metal silicidation process are provided in the present invention. In one embodiment, In one embodiment, a method for annealing a contact metal layer for a silicidation process in a semiconductor device includes providing a substrate having a contact metal layer disposed thereon in a thermal annealing processing chamber, providing a heat energy to the contact metal layer in the thermal processing chamber, supplying a gas mixture including a nitrogen gas and a hydrogen gas while providing the heat energy to the contact layer in the thermal processing chamber, wherein the nitrogen gas and the hydrogen gas is supplied at a ratio between about 1:10 and about 1:1, and forming a metal silicide layer on the substrate.

In another embodiment, a method for forming a metal silicidation process in a contact structure in a semiconductor device includes providing a substrate having film stack including a first dielectric layer disposed on a first electrode layer disposed thereon, wherein the film stack has an opening formed in the film stack through the first dielectric layer and the first electrode layer, forming a contact metal layer lining sidewalls and a bottom of the opening, providing a heat energy to the contact metal, supplying a gas mixture including a nitrogen gas and a hydrogen gas while providing the heat energy to the contact, and forming a metal silicide layer in the opening of the film stack.

In yet another embodiment, a method for forming a metal silicidation process in a contact structure in a semiconductor device includes providing a substrate having a contact metal layer disposed thereon in a thermal annealing processing chamber, providing a heat energy to the contact metal layer in the thermal processing chamber, supplying a gas mixture including only hydrogen gas while providing the heat energy to the contact layer in the thermal processing chamber, and forming an amorphous type metal silicide layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

As will be explained in greater detail below, a substrate is deposited with a contact metal layer configured to form a metal silicide layer thereon after performing an annealing process to the substrate. The term "substrate" as used herein refers to a layer of material that serves as a basis for subsequent processing operations and includes a surface to be cleaned for forming a metal silicide layer thereon. For example, the substrate can include one or more conductive metals, such as aluminum, copper, cobalt, tungsten, or combinations thereof. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application. In one or more embodiments, the substrate can form a gate structure including a gate dielectric layer and a gate electrode layer to facilitate connecting with an interconnect feature, such as a plug, via, contact, line, and wire, subsequently formed thereon.

Moreover, the substrate is not limited to any particular size or shape. The substrate can be a round wafer having a 200 mm diameter, a 300 mm diameter or other diameters, such as 450 mm or others. The substrate can also be any polygonal, square, rectangular, curved or otherwise non-circular workpiece, such as a polygonal glass substrate used in the fabrication of flat panel displays.

The present invention provides methods for annealing a contact metal layer disposed on a substrate to perform a metal silicidation process. The annealing process may efficiently provide thermal energy to the contact metal layer in a desired regulated gas environment to form a metal silicide layer with high crystallinity, thereby reducing contact resistance and improving device performance.

Figure 1:
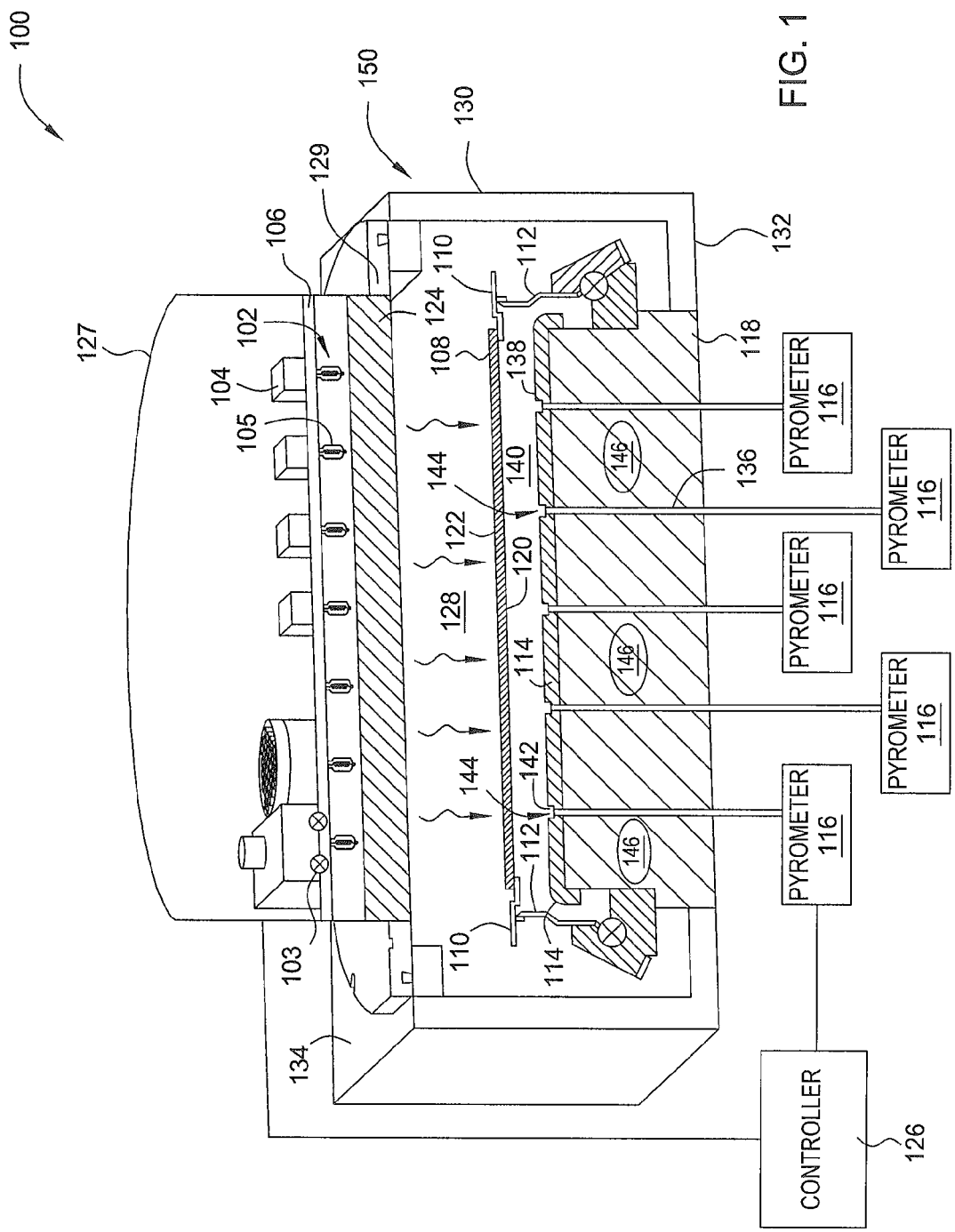
FIG. 1 depicts a sectional perspective view of one embodiment of a thermal processing chamber used to perform one embodiment of the present invention.

FIG. 1 depicts a simplified sectional perspective view of one embodiment of a thermal processing chamber 100. Examples of the thermal processing chambers that may be adapted to benefit from the invention are Dual Mode Degas (DMD) thermal processing system, available from Applied Material, Inc., located in Santa Clara, Calif. It is contemplated that other types of thermal processing systems, including those from other manufactures, may also be utilized to perform the present invention.

The processing chamber 100 includes a chamber body 150 having chamber walls 130, a bottom 132, and a top 134 defining an interior volume 128. The walls 130 typically include at least one substrate access port (not shown) to facilitate entry and egress of a substrate 108.

A lamp heat assembly 102 is disposed below a cover 127 mounted to a lid 129 disposed on the top 134 of the chamber body 150. The lamp heat assembly 124 is utilized to heat the substrate 108 suspended by an edge ring 110 disposed around the periphery of the substrate 108. The lamp heat assembly 102 includes a plurality of lamp bulbs 105. Each lamp bulb 105 may include a halogen lamp assembly. The lamp bulbs 105 may provide high energy to thermally process the substrate, such as annealing a silicon layer disposed on the substrate 108. The plurality of the lamp bulbs 105 may be coupled to a lamp plate 106 disposed thereabove. A plurality of lamp temperature switches 104 may be utilized to provide a signal to shut off power to the lamp heat assembly 102 if the temperature on the lamp plate 106 exceeds a desired set point, such as for example about 96 degrees Celsius. A cooling water connector 103 may be utilized to provide a water connection to remove excess heat generated by the lamp heat assembly 102.

A metallic reflector 124 may be disposed below the lamp heat assembly 102 and above the substrate 108 to reflect heat energy toward the substrate surface. The metallic reflector 124 may be an aluminum plate.

The edge ring 110 that supports the substrate 108 is spaced above a stainless steel base 118 by a rotatable quartz cylinder 112 mounted on a stainless steel base 118. The edge ring 110 may be fabricated from a hard material with a small coefficient of thermal expansion, such as silicon carbide, to prevent excessive expansion and contraction during thermal processing. The quartz cylinder 112 is rotated between about 50 revolutions per minutes (rpm) and about 300 rpm during substrate processing to maximize substrate temperature uniformity by minimizing the effect of thermal asymmetries in the chamber 100 and on the substrate 108. In one embodiment, the cylinder 112 may be coated with silicon to render the cylinder opaque to a desired wavelength. The base 118 has a circulation circuit 146 allowing coolant, such as water, to circulate therethrough. The coolant circulation efficiently cools down the chamber temperature after processing.

A reflector plate 114 is disposed below the substrate 108 and mounted above the base 118. An array of temperature probes 144 is embedded in the reflector plate 114 through openings 142 defined therein. The temperature probes 144 are connected to pyrometers 116 through a conduit 136 that extends from the bottom side of the base 118 to the openings 142 in the reflector plate 114. The temperature probes 144 and pyrometers 116 are used to obtain a metric indicative of temperatures of regions of the substrate 108 proximate each probe 144 such that a temperature gradient of the substrate may be determined.

The bottom side 120 of the substrate 108 and the upper side 138 of the reflector plate 114 bound a reflecting cavity 140 therebetween. The reflecting cavity 140 enhances the effective emissivity of the substrate 108, thereby improving the accuracy of the temperature measurement. A controller 126 may receive measurements from the pyrometers 116 and output control signals to radiant heat assembly 124 for real-time modify the radiation generated in the processing chamber 100, thereby maintaining the substrate temperature within a desired processing range.

The upper side 138 of the reflector plate 114 is highly reflective, and reflects thermal radiation in a target wavelength range and absorbs thermal radiation other then the target wavelength range. One or more coating or layers may be utilized to coat the reflector plate 114 on the base 118 to provide the selective reflectivity. For example, different combination of coatings with different reflectivity and absorbability may be utilized to enable the reflector plate 114 to reflect thermal radiation at a desired wavelength back to the substrate 108 and absorb (or less reflect) thermal radiation other than the desired wavelength. In one embodiment, the reflector plate 114 reflects the thermal wavelength between about 700 nm and about 1000 nm, and absorbs thermal wavelength below 700 nm and above 1000 nm. One reflector plate 114 that may be adapted to benefit from the invention is described in U.S. Pat. No. 6,839,507, issued Jan. 4, 2005 to Adams, et al., and is hereby incorporated by reference in its entirety.

The thermal energy not reflected to back to the substrate 108 is absorbed by the reflector plate 114. The absorbed thermal energy is efficiently and rapidly removed by the coolant circulating through the base 118 disposed below the reflector plate 114. Additionally, gas provided through holes (not shown) in the reflector plate 114 may be utilized to promote the cooling rate of the reflector plate 114 and the substrate 108 positioned thereabove. The rapid cool down rate provided by the reflector plate 114 promotes the temperature control of the substrate 108, thereby efficiently providing a desired temperature processing profile. In one embodiment, the reflector plate 114 may provide a substrate cool date rate greater than about 200 degrees Celsius per second. In another embodiment, the reflector plate 114 may provide a substrate cool rate of about 220 degrees Celsius per second.

Figure 2:
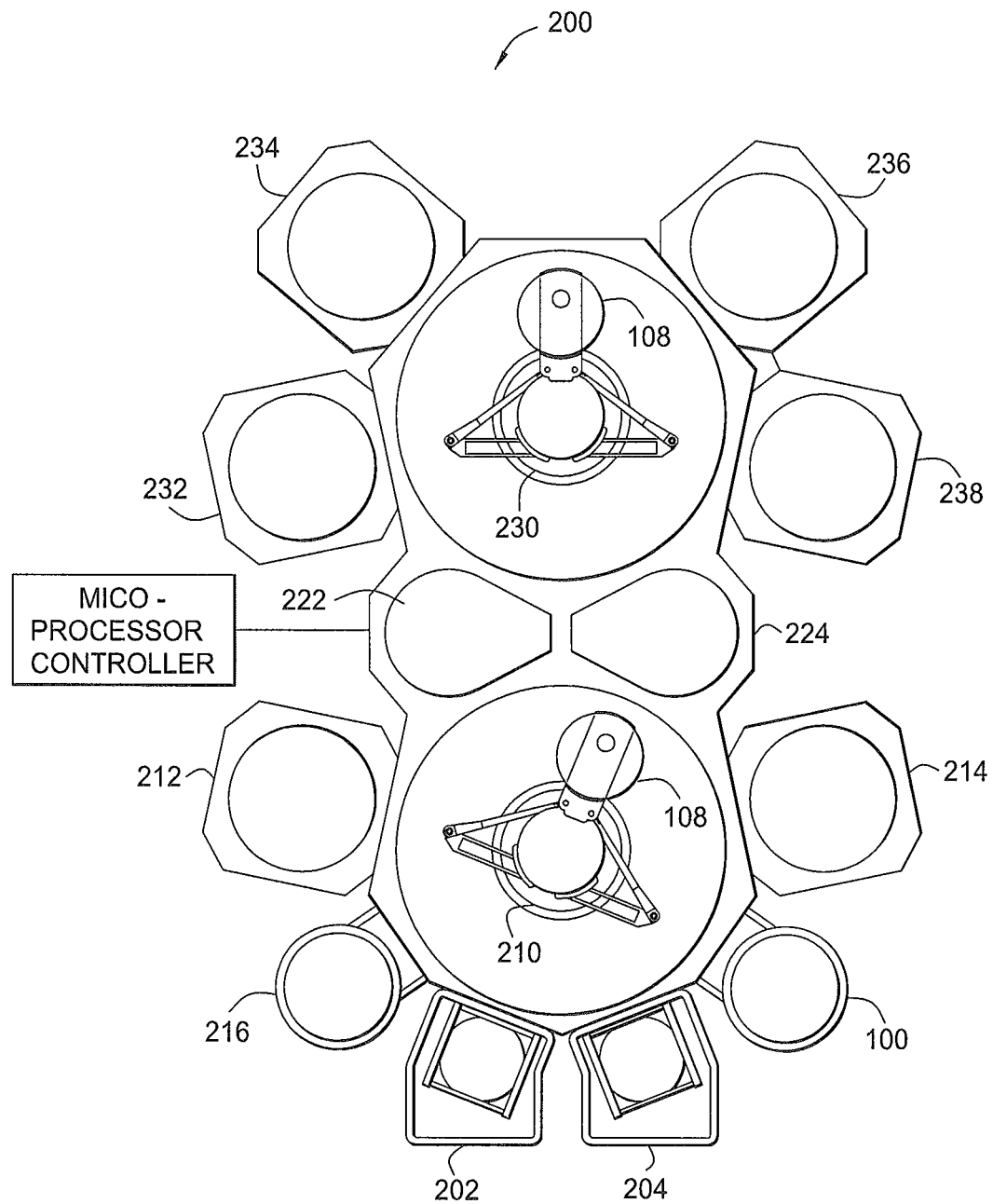
FIG. 2 is a schematic top-view diagram of an illustrative multi-chamber processing system that may have the thermal processing chamber of FIG. 1 incorporated therein.

FIG. 2 is a schematic top view diagram of an illustrative multi-chamber processing system 200 that can be adapted to perform a thermal annealing process as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can be "pumped down" to introduce the substrates introduced into the system 200. A first robot 210 can transfer the substrates between the load lock chambers 202, 204, and a first set of one or more substrate processing chambers 212, 214, 216, 100 (four are shown). Each processing chamber 212, 214, 216 is configured to be at least one of substrate deposition process, such as cyclical layer deposition (CLD), atomic layer deposition (ALD), chemical vapor deposition (CVD), physical vapor deposition (PVD), etch, degas, orientation and other substrate processes. Furthermore, one of the processing chamber 212, 214, 216 may also be configured to perform a pre-clean process prior to performing a deposition process or a thermal annealing process to the substrate. The position of the processing chamber 100 utilized to perform a thermal annealing process relative to the other chambers 212, 214, 216 is for illustration, and the position of the processing chamber 100 may be optionally be switched with any one of the processing chambers 212, 214, 216 if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 100, the processing chambers 232, 234, 236, 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 212, 214, 216, 232, 234, 236, 238 can be removed from the system 200 if not necessary for a particular process to be performed by the system 200. After the preclean, deposition and/or an thermal annealing process is performed in any one of the processing chamber 100, the substrate may further be transferred to any of the processing chambers 212, 214, 216, 232, 234, 236, 238 of the system 200 to perform other process as needed.

Figure 3:
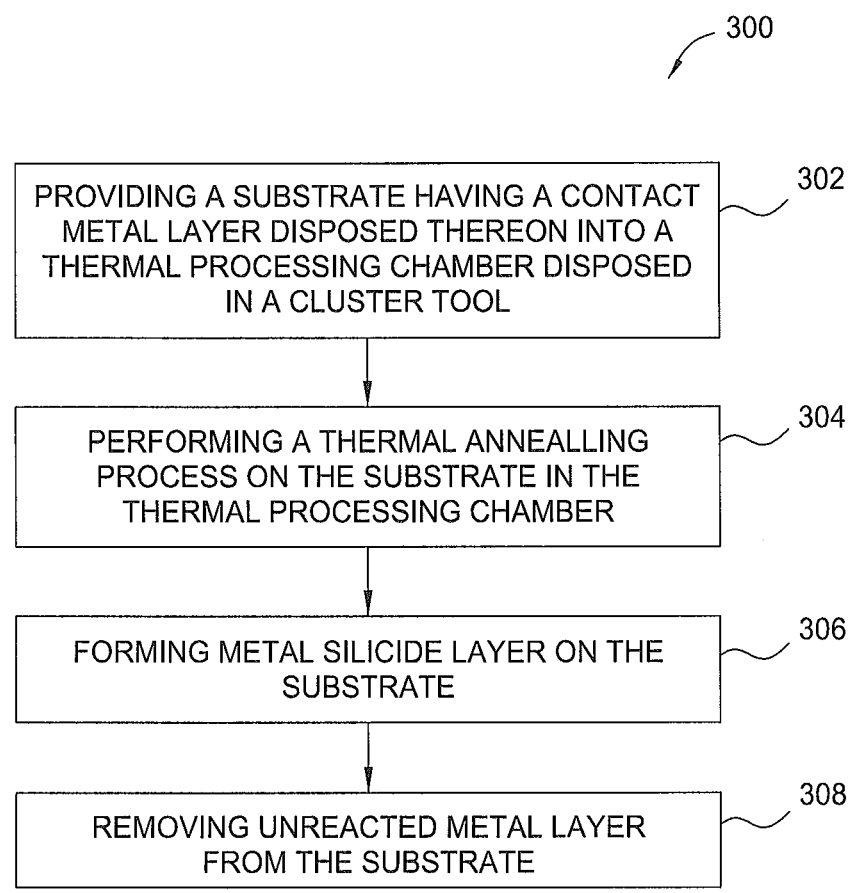
FIG. 3 depicts a flow diagram for annealing a semiconductor device formed on a substrate to perform a metal silicidation process in accordance with one embodiment of the present invention.
Figure 4A:
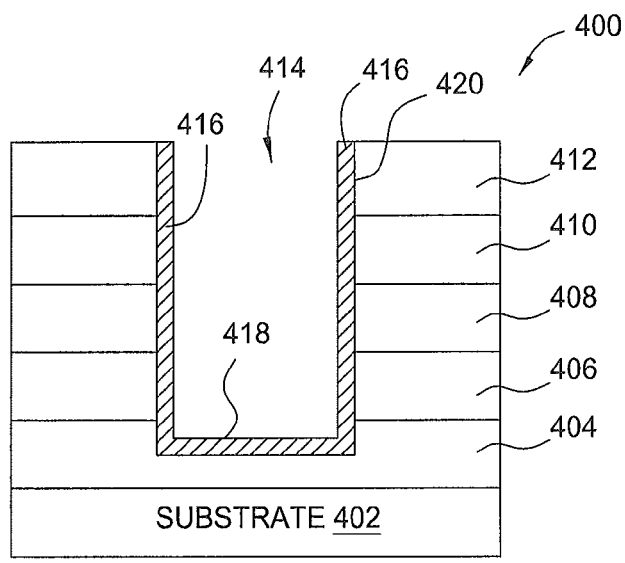
FIGS. 4A-4C depict cross-sectional views of a semiconductor device during the formation of a metal silicidation structure in accordance with one embodiment of the present invention.
Figure 4B:
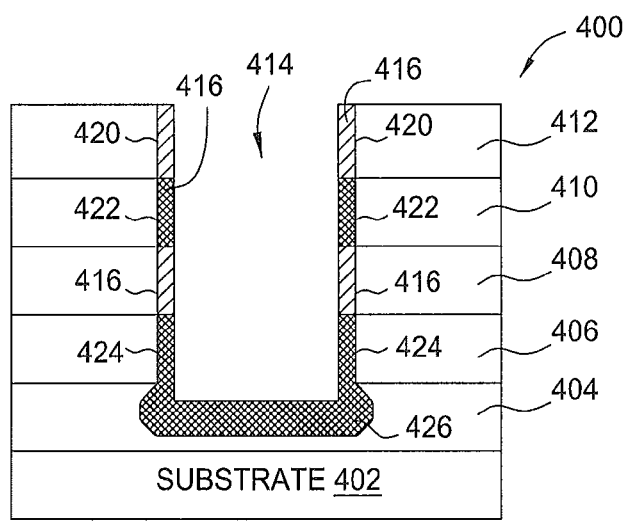
Figure 4C:
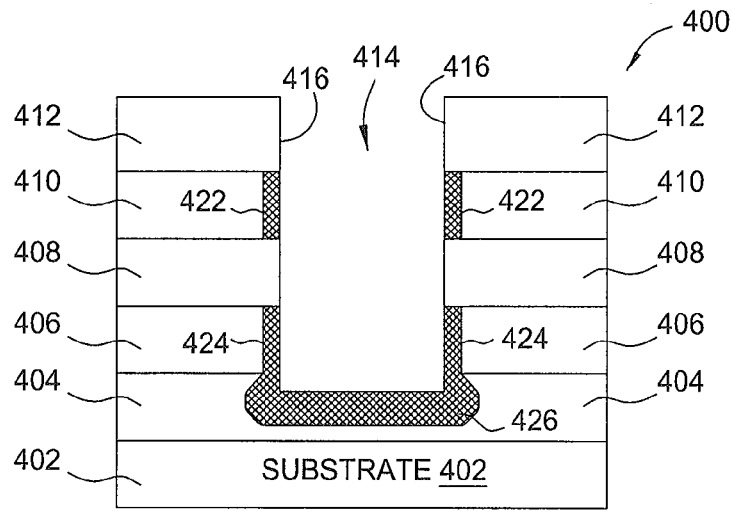

FIG. 3 illustrates a process sequence 300 used to form a metal silicide layer in a semiconductor device structure on a substrate. The sequence described in FIG. 3 corresponds to the fabrication stages depicted in FIGS. 4A-4C, which is discussed below. FIGS. 4A-4C illustrate schematic cross-sectional views of a substrate 402 having a device structure 400 formed thereon during different stages of fabricating a metal silicide layer on the device structure 400 illustrated by the processing sequence 300.

The process sequence 300 starts at step 302 by providing a substrate, such as the substrate 402 depicted in FIG. 4A, into the processing chamber, such as the processing chamber 100 depicted in FIG. 1, or other suitable processing chamber. The substrate 402 shown in FIG. 4A includes a semiconductor device structure 400 (e.g., such as a gate structure) formed on the substrate 402. It is noted that this particular device structure 400 may be used in three-dimensional (3-D) flash memory applications, DRAM applications, or other suitable applications with high aspect ratio or other odd geometries. In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm, 300 mm or 450 mm diameter wafers or other dimensions, as well as, rectangular or square panels. Unless otherwise noted, embodiments and examples described herein are conducted on substrates with a 200 mm diameter or a 300 mm diameter, particularly a 300 mm diameter.

A silicon containing layer 404 is formed on the substrate 402. The device structure 400 may include multiple layers disposed therein. For example, in the embodiment depicted in FIG. 4A, the device structure 400 includes a first gate electrode layer 406 disposed on the silicon containing layer 404 and a first gate dielectric layer 408 disposed on the first gate electrode layer 406. Another pair of a second dielectric layer 412 and a second gate electrode layer 410 may be disposed on the first gate dielectric layer 408 as needed. An opening 414, such as a contact opening, contact via, contact trench, or called contact channel, is formed in the device structure 400 to form an open cannel to expose the underlying silicon containing layer 404. A contact metal layer 416 may be formed conformally and lining on sidewalls 420 and bottom 418 of the opening 414. The contact metal layer 416 is a metal layer later utilized to form a metal silicide layer after a thermal annealing process, which will be further discussed below. Suitable examples of the contact metal layer 416 include tungsten (W), titanium (Ti), hafnium (Hf), cobalt (Co), nickel (Ni), alloys thereof, or any combination thereof. The contact metal layer 416 may be deposited on the substrate by a physical vapor deposition technique (PVD), a CVD technique, an atomic layer deposition technique, or other suitable deposition method. In one embodiment, the contact metal layer 416 may be deposited is maintained at a temperature between about 10 degrees Celsius and about 600 degrees Celsius during the deposition process, such as 250 degrees Celsius and 450 degrees Celsius by a PVD, CVD or an ALD process. In the embodiment depicted herein, the contact metal layer 416 is a cobalt layer formed by a CVD process that can provide a conformal deposition of the metal contact layer 416 to both sidewalls 420 and bottom 418 of the opening 414 formed in the device structure 400. It is noted that the contact metal layer 416 deposited over other portions of the substrate 402 may be removed later by conventional etching steps after silicidation process utilized in the semiconductor devices manufacture.

The silicon containing layer 404 may be a polysilicon layer, a microcrystalline silicon layer, a monocrystalline silicon, a doped polysilicon layer, a doped microcrystalline silicon layer or a doped monocrystalline silicon. Suitable dopants doped in the silicon containing layer 404 may include p-type dopants and n-type dopants, such as B containing dopants or P containing dopants. In one embodiment, the silicon containing layer 404 described herein is a polysilicon layer or a boron doped p-type silicon containing layer. In one embodiment, the first and the second gate electrode layer 406, 410 may be a polysilicon layer, a doped silicon layer, or other suitable silicon containing material. In another embodiment, the first and the second gate electrode layer 406, 410 may be a composite film including a polysilicon layer disposed on or including other metal materials disposed therein. The first and the second dielectric layer 408, 412 may be a dielectric material selected from a group consisting of an oxide layer, silicon oxide layer, a silicon nitride layer, a nitride layer, titanium nitride layer, a composite of oxide and nitride layer, at least one or more oxide layers sandwiching a nitride layer, and combinations thereof, among others.

At step 304, a thermal annealing process is performed in a thermal annealing chamber, such as the thermal annealing chamber 100 depicted in FIG. 1, on the substrate 402 to form a metal silicidation layer 422, 424, 426 on the substrate 402, as shown in FIG. 4B. The silicidation process converts the contact metal layer 416 deposited over a top surface of the silicon containing layer 404 and the sidewalls of the first and the second gate electrode layer 406, 410 (e.g., silicon layers) of the substrate 402 into metal silicide layers 426, 424, 422, as shown in FIG. 4B. The contact metal layer 416 disposed over the sidewalls of the first and the second gate dielectric layer 416, 420 will be remained unreacted and will be later etched away from the substrate 402.

In one embodiment, the thermal annealing process performed at step 304 to execute the silicidation process may have a temperature range between about 400 degrees Celsius and about 1400 degrees Celsius, such as between about 200 degrees Celsius and about 500 degrees Celsius. During the thermal annealing process, a gas mixture including at least a nitrogen containing gas is supplied into the annealing chamber. It is believed that the nitrogen containing gas supplied during the annealing process may assist increasing crystallinity of the metal silicide layer 422, 424, 426 formed on the substrate 402. It is believed that portion of the nitrogen elements supplied in the nitrogen containing gas may be incorporated into the metal silicide layer 422, 424, 426, forming a metal silicide nitride layer, which may assist enhancing plane (111) orientation of the resultant metal silicide layer 422, 424, 426, thereby increasing the crystallinity of the metal silicide layer 422, 424, 426. It is believed that high crystallinity of the metal silicide layer may assist reducing contact resistance in semiconductor devices, thereby advantageously improving device performance.

In one embodiment, the thermal annealing process at 304 may be performed by supplying a gas mixture including at least a nitrogen containing gas into the annealing chamber at a flow rate between about 100 sccm and about 2000 sccm, controlling a chamber pressure of about 0.5 Torr and about 15 Torr, maintaining a temperature range between about 200 degrees Celsius and about 500 degrees Celsius and performing the thermal annealing process, optionally while rotating the substrate, for between about 30 seconds and about 180 seconds to form the metal silicide layer 422, 424, 426. Suitable examples of the nitrogen containing gas include nitrogen gas, ammonia gas, or nitrogen oxide. In one particular embodiment described herein, the nitrogen containing gas is a nitrogen gas ($N_2$). In the embodiment wherein the silicon containing layer 404 and/or the first and the second gate electrode layer 406, 410 are silicon layers with p-type dopants, such as boron (B), doped therein, nitrogen gas ($N_2$) may be used in the gas mixture to perform the thermal annealing process.

In another embodiment, the gas mixture supplied in the thermal annealing chamber 100 may further includes a hydrogen gas, an inert gas or other gases as needed. In one embodiment, the gas mixture supplied into the processing chamber to perform the silicidation process includes a nitrogen gas ($N_2$) and a hydrogen gas ($H_2$) supplied at a flow ratio between about 1:10 and about 1:1, such as about 1:3. In the embodiment wherein the silicon containing layer 404 and/or the first and the second gate electrode layer 406, 410 are silicon layers without dopants doped therein, the gas mixture including a nitrogen gas ($N_2$) and a hydrogen gas may be used to perform the thermal annealing process. In the embodiment wherein a more amorphous-type metal sicilide layer 422, 424, 426 is desired, a pure hydrogen gas may be supplied to the thermal processing chamber to have the resultant metal sicilide layer 422, 424, 426 more amorphous oriented, instead of having high crystallinity in plane (111) orientation.

An example of a suitable thermal processing chamber, in which step 304 may be performed, is a dual mode degas (DMD) chamber, available from Applied Materials, Inc.

At step 306, as discussed above, after the thermal annealing process 304 is performed on the substrate 202, the heat energy supplied to the contact metal layer 416 induce the metal atoms from the contact metal layer 416 to react with the silicon atoms disposed underneath the contact metal layer 416, such as the silicon atoms from the top surface of the silicon containing layer 404 and the sidewalls of the first and the second gate electrode layer 406, 410 (e.g., silicon layers) of the substrate 402. The metal atoms from the contact metal layer 416 only reacts with the silicon atoms from the silicon layers formed from the first and the second gate electrode layer 406, 410 (e.g., silicon layers) of the substrate 402, which the contact metal layer 416 disposed over the sidewalls of the first and the second gate dielectric layer 416, 420 will be remained unreacted. The silicidation process is a self-limiting process. After a substantially sufficient time of thermal annealing process is performed, the metal atoms from the contact metal layer 416 may substantially react with the silicon atoms from the silicon containing layer 404, the first and the second gate electrode layer 406, 410, forming the desired metal silicide layer 422, 424, 426, only on the desired regions over the silicon containing layer 404 and the first and the second gate electrode layer 406, 410.

At step 308, after the thermal annealing process is completed, the unreacted contact metal layer 416 lining on the sidewalls 420 of the first and the second gate dielectric layers 408, 412 may be removed by any suitable etching process, as shown in FIG. 4C. After the metal silicide layer 422, 424, 426 are formed on the substrate 402, a contact structure may be then followed to be formed on the substrate to continue forming the interconnection structure on the substrate 402. The term "contact surface" as used herein refers to a layer of material that includes a metal silicide that can form part of a gate electrode.

It is noted that an optional pre-cleaning process performed prior to forming the contact metal layer 416, deposition process of the contact metal layer 416 and thermal annealing process (e.g., silicidation process) of the contact metal layer

416 may all be performed and integrated in one cluster system, such as the system 200 depicted in FIG. 2. By doing so, after the contact metal layer 416 is formed in any one of the deposition chamber disposed in the processing system 200, the substrate 402 may be further transferred to the thermal annealing chamber 100 disposed in the processing system 200 without breaking vacuum to perform the in-situ thermal annealing process. Thus, likelihood of contamination or forming native oxide on the metal contact structures may be eliminated, thereby efficiently improving the overall device performance.

Furthermore, after the unreacted metal contact layer 416 is removed from the substrate, an additional thermal annealing process may be performed. The additional thermal annealing process may be any conventional thermal annealing process available in the art to provide thermal energy to the substrate 402. This particular additional thermal annealing process may be utilized to active dopants in the substrate, or any layers disposed on the substrate 402. In addition, this additionally annealing process may also be utilized to help complete the metal silicidation process as needed. In one embodiment, the additional thermal annealing process may be performed by a conventional RTP process. The thermal annealing process is performed by a rapid thermal annealing (RTA) processing between about 2 second and 50 seconds and maintaining substrate temperature at between about 800 degrees Celsius and about 1200 degrees Celsius. It is noted that annealing process, including process time and temperature, may be varied based on different elemental dopants and dopant concentrations in the devices. An example of a suitable RTP chamber is the CENTURA™ RADIANCE™ RTP chamber, available from Applied Materials, Inc., Santa Clara, Calif. Other annealing chambers, including those from other manufacturers, may be utilized to perform the additional thermal anneal process. In another embodiment, the thermal annealing process may be performed by other suitable annealing process including a laser annealing process, a dynamic surface annealing (DSA) process or the like.

Thus, methods for annealing a contact metal layer for a metal silicidation process are provided in the present invention. The thermal annealing process may utilize a gas mixture including at least a nitrogen containing gas during annealing to efficiently improve crystallinity of the formed metal silicide layer, thereby advantageously improving device performance. Furthermore, by performing the in-situ thermal annealing process in a cluster system, the likelihood of contamination or forming undesired native oxide on the contact metal surface may be eliminated, thereby efficiently reducing contact resistivity during manufacture of the contact structure in the semiconductor devices.

While the foregoing is directed to embodiments of the present invention, other and further embodiments of the invention may be devised without departing from the basic scope thereof, and the scope thereof is determined by the claims that follow.

The invention claimed is:

1. A method for annealing a contact metal layer for a metal silicidation process in a semiconductor device, comprising:
   providing a heat energy to a substrate having a contact metal exposed on the substrate into a thermal processing chamber;
   supplying a gas mixture including a nitrogen gas and a hydrogen gas to the exposed contact metal layer while providing the heat energy to the exposed contact metal layer in the thermal processing chamber, wherein the nitrogen gas and the hydrogen gas is supplied at a ratio between about 1:10 and about 1:1; and
   converting the exposed contact metal layer into a metal silicide layer on the substrate.

2. The method of claim 1, wherein providing the heat energy to the contact metal layer further comprises:
   controlling a substrate temperature at between about 250 degrees Celsius and about 500 degrees Celsius.

3. The method of claim 1, wherein the metal contact layer is formed in a processing chamber incorporated in a cluster system the same as where the thermal annealing processing chamber is incorporated to.

4. The method of claim 1, wherein the metal silicide layer is formed on sidewalls of a gate electrode layer disposed on the substrate.

5. The method of claim 1, wherein converting the exposed contact metal layer into the metal silicide layer further comprises:
   forming the metal silicide layer with plane (111) orientation.

6. The method of claim 1, wherein the contact metal layer is formed by a chemical vapor deposition (CVD) process.

7. The method of claim 1, wherein the metal contact layer is a cobalt layer.

8. The method of claim 1, wherein providing the heat energy to the contact metal layer further comprises:
   performing the thermal annealing process for between about 30 seconds and about 180 seconds.

9. A method for forming a metal silicidation process in a contact structure in a semiconductor device, comprising:
   providing a heat energy to contact metal layer exposed on a substrate, wherein the contact metal layer is disposed on a film stack disposed on the substrate, the film stack including a first dielectric layer disposed on a first electrode layer, wherein the film stack has an opening formed in the film stack through the first dielectric layer and the first electrode layer and the exposed contact metal layer is disposed on the film stack lining on sidewalls and a bottom of the opening;
   providing a heat energy to the exposed contact metal layer;
   supplying a gas mixture including a nitrogen gas and a hydrogen gas to the exposed contact metal layer while providing the heat energy to the exposed contact metal layer; and
   converting the exposed contact metal layer into a metal silicide layer in the opening of the film stack.

10. The method of claim 9, wherein the nitrogen gas and the hydrogen gas is supplied at a ratio between about 1:10 and about 1:1.

11. The method of claim 9, wherein the film stack further comprises a second electrode disposed on the first dielectric layer.

12. The method of claim 11, wherein the film stack further comprises a second dielectric layer disposed on the second electrode layer.

13. The method of claim 12, wherein the opening is formed through the second dielectric layer and the second electrode layer.

14. The method of claim 9, wherein converting the exposed contact metal layer into the metal silicide layer in the opening of the film stack further comprising:
   forming metal silicide layer in the first electrode layer.

15. The method of claim 9, further comprising:
   removing the contact metal layer unreacted with the first dielectric layer from the substrate.

16. The method of claim 9, wherein the film stack further comprises a silicon containing layer disposed between the substrate and the first electrode layer.

17. The method of claim 16, wherein the silicon containing layer is one of a polysilicon layer, a microcrystalline silicon layer, a monocrystalline silicon layer, a doped polysilicon layer, a doped microcrystalline silicon layer or a doped monocrystalline silicon layer.

18. The method of claim 11, wherein the first and the second electrode layer are one of a polysilicon layer, a doped silicon layer or silicon containing materials.

* * * * *

UNITED STATES PATENT AND TRADEMARK OFFICE
CERTIFICATE OF CORRECTION

| | | |
|---|---|---|
| PATENT NO. | : 8,927,423 B2 | Page 1 of 1 |
| APPLICATION NO. | : 13/714588 | |
| DATED | : January 6, 2015 | |
| INVENTOR(S) | : Fu et al. | |

It is certified that error appears in the above-identified patent and that said Letters Patent is hereby corrected as shown below:

Title Page, (71) Applicants:

Please delete "Xinyu Fu, Pleasanton, CA (US); Wei Tang, Santa Clara, CA (US); Kavita Shah, Mountain View, CA (US); Srinivas Gandikota, Santa Clara, CA (US); San H. Yu, Cupertino, CA (US); Avgerinos Gelatos, Redwood City, CA (US)"and insert -- Applied Materials, Inc., Santa Clara, CA (US) -- therefor;

In the Drawings:

Sheet 2 of 4, please delete "Mico-Processor Controller" and insert -- Micro-Processor Controller -- therefor;

In the Specification, In the Detailed Description of the Invention:

Column 8, Line 22, please delete "sicilide" and insert -- silicide -- therefor;

Column 8, Line 24, please delete "sicilide" and insert -- silicide -- therefor.

Signed and Sealed this
Sixteenth Day of June, 2015

Michelle K. Lee
*Director of the United States Patent and Trademark Office*